United States Patent
Lee et al.

(10) Patent No.: US 8,797,434 B2
(45) Date of Patent: Aug. 5, 2014

(54) CMOS IMAGE SENSOR HAVING WIDE DYNAMIC RANGE AND SENSING METHOD THEREOF

(75) Inventors: Jawoong Lee, Gyeonggi-do (KR); Jun hee Cho, Chungju-si (KR); Jong Beom Choi, Seoul (KR)

(73) Assignee: Zeeann Co., Ltd, Hanam-si Gyeonggi-do (KR)

( * ) Notice: Subject to any disclaimer, the term of this patent is extended or adjusted under 35 U.S.C. 154(b) by 155 days.

(21) Appl. No.: 13/138,630

(22) PCT Filed: Mar. 10, 2010

(86) PCT No.: PCT/KR2010/001494
§ 371 (c)(1),
(2), (4) Date: Oct. 26, 2011

(87) PCT Pub. No.: WO2010/107200
PCT Pub. Date: Sep. 23, 2010

(65) Prior Publication Data
US 2012/0033118 A1    Feb. 9, 2012

(30) Foreign Application Priority Data
Mar. 16, 2009    (KR) .................. 10-2009-0022227

(51) Int. Cl.
| | | |
|---|---|---|
| H04N 3/14 | (2006.01) | |
| H04N 5/335 | (2011.01) | |
| H01L 27/146 | (2006.01) | |
| H04N 5/355 | (2011.01) | |

(52) U.S. Cl.
CPC ...... *H01L 27/14609* (2013.01); *H04N 5/35554* (2013.01); *H04N 3/37452* (2013.01)
USPC ......... 348/299; 348/294; 348/302; 250/208.1

(58) Field of Classification Search
USPC .......................................... 348/294, 299, 302
See application file for complete search history.

(56) References Cited

U.S. PATENT DOCUMENTS

| | | | |
|---|---|---|---|
| 6,888,122 B2 | 5/2005 | Fossum | |
| 6,972,794 B1 * | 12/2005 | Wang et al. | .................. 348/302 |

(Continued)

FOREIGN PATENT DOCUMENTS

| | | | |
|---|---|---|---|
| JP | 2005-065184 A | 3/2005 | |
| JP | 2006-080937 A | 3/2006 | |

(Continued)

OTHER PUBLICATIONS

Korean Intellectual Property Office, International Preliminary Report on Patentability, Daejeon, Republic of Korea, Oct. 7, 2010.

(Continued)

*Primary Examiner* — Anthony J Daniels
(74) *Attorney, Agent, or Firm* — Marshall & Melhorn, LLC

(57) ABSTRACT

Disclosed are a CMOS image sensor having a wide dynamic range and a sensing method thereof. Each unit pixel of the CMOS image sensor of the present invention includes multiple processing units, so that one shuttering section for the image generation of one image frame can be divided into multiple sections to separately shutter and sample the divided sections by each processing unit. Thus, the image sensor of the present invention enables many shuttering actions to be performed in the multiple processing units, respectively, and the multiple processing units to separately sample each floating diffusion voltage caused by the shuttering actions, thereby realizing a wide dynamic range.

10 Claims, 7 Drawing Sheets

(56) References Cited

U.S. PATENT DOCUMENTS

| | | |
|---|---|---|
| 7,050,094 B2 | 5/2006 | Krymski |
| 7,209,166 B2 | 4/2007 | Krymski |
| 7,442,910 B2 | 10/2008 | Fossum |
| 7,443,427 B2 | 10/2008 | Takayanagi |
| 7,489,352 B2 | 2/2009 | Nakamura |
| 7,531,858 B2 | 5/2009 | Lee |
| 7,616,242 B2 | 11/2009 | Ando et al. |
| 7,733,382 B2 | 6/2010 | Takayanagi |
| 7,990,449 B2 | 8/2011 | Fossum |
| 8,345,136 B2 * | 1/2013 | Song et al. .................... 348/308 |
| 2009/0095986 A1 * | 4/2009 | Neukom ....................... 257/225 |
| 2010/0177221 A1 | 7/2010 | Lee |
| 2013/0277537 A1 * | 10/2013 | Altice et al. ............... 250/208.1 |

FOREIGN PATENT DOCUMENTS

| | | |
|---|---|---|
| KR | 10-0523672 B1 | 10/2005 |
| KR | 2007-0062032 A | 6/2007 |
| KR | 10-0835894 B1 | 6/2008 |
| KR | 10-0865111 B1 | 10/2008 |

OTHER PUBLICATIONS

PCT/IB/373 and PCT/ISA/237; and English translation of same issued by The International Bureau of WIPO on Oct. 25, 2011, Geneva, Switzerland.

* cited by examiner

CMOS IMAGE SENSOR HAVING WIDE DYNAMIC RANGE AND SENSING METHOD THEREOF

TECHNICAL FIELD

The present invention relates to a CMOS image sensor having wide dynamic range with respect to the brightness of the light and a sensing method thereof.

BACKGROUND ART

CMOS (Complementary Metal Oxide Semiconductor) image sensor is a sensor produced using a CMOS manufacturing technology, which converts the light incident on each pixel of the sensor into electrons using photodiodes and then outputs voltage signals in proportion to the number of electrons, thereby making them images.

Dynamic range within which a conventional CMOS image sensor properly responds to the brightness of the light is about 60 dB. In other words, the image sensor normally responds to the light ranging from the sensible minimal brightness of the light to about 1000 times of it, thereby outputting signals. Even in the art, a number of methods to widen the dynamic range of the CMOS image sensor have been suggested.

For example, U.S. Pat. No. 7,443,427 discloses a pixel structure having logarithmic dynamic range for light, and U.S. Pat. Nos. 7,442,910 and 7,209,166 suggest methods for increasing dynamic range by changing capacitors being electron storages in pixel through switch operation.

Further, Korean Patent Nos. 0835894 and 0865111 and U.S. Pat. No. 7,489,352 disclose methods in which two small and large photodiodes are constructed and two signals are output from the photodiodes, the two signals different responsivity to the light each other.

There are reported methods for extending a dynamic range of sensor by operating a transfer gate or a reset transistor several times in the process of obtaining signals from a normal pixel having a four-transistor structure, and others.

Since merits coexist with demerits in such various methods, it is not easy to say which method is remarkably superior to the others.

CITATION LIST

U.S. Pat. Nos. 7,443,427
7,442,910
7,209,166
Korean Patent No. 0835894
Korean Patent No. 0865111
U.S. Pat. No. 7,489,352

SUMMARY OF INVENTION

Technical Problem

The present invention provides a CMOS image sensor and a sensing method thereof, capable of embodying wide dynamic range by simultaneously outputting two or more output signals corresponding to different exposure integration times in a pixel without any need of additional external memories outside the pixel and with relatively simple image processing.

The present invention also provides a CMOS image sensor and a sensing method thereof, capable of embodying wide dynamic range in both rolling shuttering and global shuttering schemes.

The present invention also provides a CMOS image sensor and a sensing method thereof, in which there is not needed any additional specific process except processes to manufacture a 4-transistor CMOS image sensor pixel in the art in order to manufacture a pixel of a CMOS image sensor having wide dynamic range.

Solution to Problem

In a CMOS image sensor including an array of unit pixels according to the present invention, the unit pixel is connected to a first output signal line and a second output signal line that are arranged in each column of the array.

Further, the unit pixel includes a photodiode; a first processing unit connected to the photodiode, that amplifies a first floating diffusion voltage formed by being provided with electrons accumulated in the photodiode during a first exposure integration time and outputs the amplified voltage to the first output signal line; a second processing unit connected to the photodiode, that amplifies a second floating diffusion voltage formed by being provided with electrons accumulated in the photodiode during a second exposure integration time which is separated from the first exposure integration time and outputs the amplified voltage to the second output signal line; and an erasing transfer gate transistor arranged between the photodiode and a power supply voltage, that discharges electrons accumulated in the photodiode during the time other than the first and second exposure integration times so as to reset the photodiode.

In this case, it is desirable that the output signals of the first and second processing units are simultaneously transmitted to the first and second output signal lines that are arranged in each column.

According to another embodiment of the present invention, the unit pixel of the CMOS image sensor including an array of unit pixels, may be connected to an output signal line arranged in each column of the array. In this case, the first and second processing units may be connected to the same output signal line.

Here, the CMOS image sensor according to the present invention may further include two switches arranged between the output signal line and two analog to digital converters corresponding to the first and second processing units respectively.

In this embodiment, the first and second processing units may be applied with any structure. For example, the first processing unit may have a 4-transistor structure including a first floating diffusion that receives and stores the electrons accumulated in the photodiode; a first transfer gate transistor that controls transferring of the electrons accumulated in the photodiode to the first floating diffusion; a first reset transistor that resets the voltage value of the first floating diffusion; a first source follower transistor that amplifies and outputs the voltage value of the first floating diffusion; and a first address transistor that connects the output of the first source follower transistor to the first output signal line.

Hereinbefore, only an example including first and second processing units in a unit pixel is described. However, the unit pixel may further include at least one processing unit connected to the photodiode, that amplifies the floating diffusion voltage of its own formed by being provided with electrons accumulated in the photodiode during an exposure integration time other than the first and second exposure integration times.

According to yet another embodiment of the present invention, a sensing method of a CMOS image sensor including an array of unit pixels includes dividing a shuttering section to obtain an image frame into a first exposure integration time and a second exposure integration time; performing double shuttering by implementing a procedure to accumulate electrons in a photodiode during the first exposure integration time, transfer and store the electrons in a first floating diffusion and then accumulate electrons in the photodiode during the second exposure integration time, transfer and store the electrons in a second floating diffusion, the procedure being simultaneously implemented for all pixels of the pixel array; performing sampling by reading voltages generated by the electrons stored in the first and second floating diffusions through the double shuttering according a double sampling method respectively, and transmitting the voltages to the output signal lines connected to the unit pixel; and sequentially repeating the sampling row by row in the pixel array, the sampling being simultaneously performed with respect to all unit pixels of each row, thereby embodying a method for obtaining a double exposure integration time global shuttering image.

According to still yet another embodiment of the present invention, a sensing method of a CMOS image sensor including an array of unit pixels includes dividing a shuttering section to obtain an image frame into a first exposure integration time and a second exposure integration time; performing double shuttering by accumulating electrons in a photodiode during a first exposure integration time, transferring and storing the electrons in the first floating diffusion, and then accumulating the electrons in the photodiode during a second exposure integration time; performing sampling by reading a voltage generated by the electrons stored in the first floating diffusion according to a double sampling method, reading a voltage generated by the electrons which are accumulated in the photodiode during the second exposure integration time and transferred into the second floating diffusion according to a correlated double sampling method and transmitting the voltages to the output signal lines connected to the unit pixel; and sequentially repeating the double shuttering and the sampling connected continuously row by row in the pixel array, thereby embodying a method for obtaining a double exposure integration time rolling shuttering image.

Here, it is desirable that the sampling includes simultaneously transmitting the voltages generated by the electrons stored in the first and second floating diffusions to two output signal lines arranged in each column of the unit pixel array, respectively.

Advantageous Effects of Invention

A CMOS image sensor according to the present invention includes a unit pixel that divisionally integrates electrons generated by the exposure of the light using a photodiode in many times, and outputs signals corresponding to the multiple exposure integrations as plural signals of one pixel in parallel, thereby largely improving the dynamic range within which the image sensor properly respond to the brightness of the light.

A CMOS image sensor according to the present invention reaches the wide dynamic range performance for both of the global shuttering and the rolling shuttering schemes.

Further, the CMOS image sensor according to the present invention can obtain wide dynamic range without including additional memories outside the pixel array and with relatively simple image processing.

Further, in fabricating pixels of the CMOS image sensor according to the present invention, there is no need to develop any additional process except processes to fabricate a general 4-transistor image sensor pixel in the art.

DESCRIPTION OF EMBODIMENTS

Figure 1:
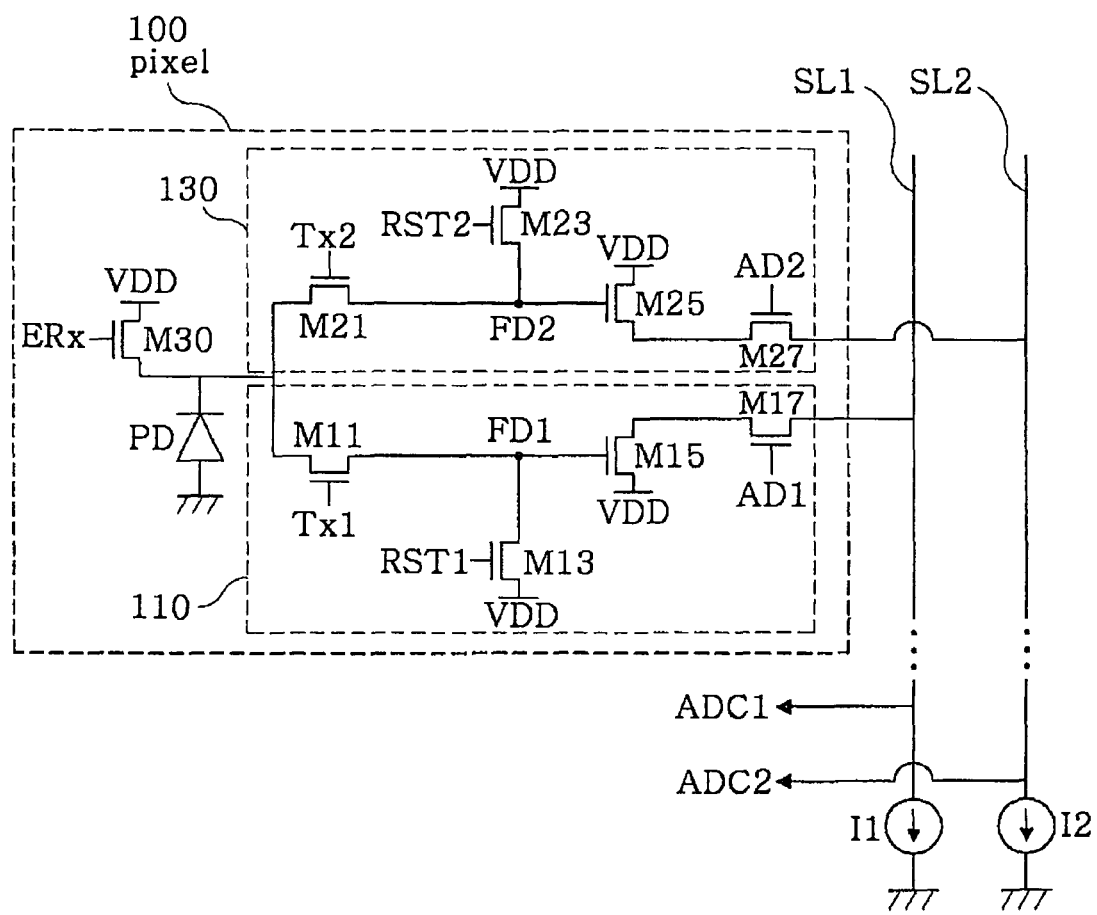
FIG. 1 is a circuit diagram showing a unit pixel of a CMOS image sensor according to an embodiment of the present invention.

In a CMOS image sensor including an array of unit pixel according to the present invention, the unit pixel is connected to a first output signal line and a second output signal line that are arranged in each column of the array.

Further, the unit pixel includes a photodiode; a first processing unit connected to the photodiode, that amplifies a first floating diffusion voltage formed by being provided with electrons accumulated in the photodiode during a first exposure integration time and transmits the amplified voltage to the first output signal line; a second processing unit connected to the photodiode, that amplifies a second floating diffusion voltage formed by being provided with electrons accumulated in the photodiode during a second exposure integration time which is separated from the first exposure integration time and transmits the amplified voltage to the second output signal line; and an erasing transfer gate transistor arranged between the photodiode and a power supply voltage, that discharges electrons accumulated in the photodiode during the time other than the first and second exposure integration times so as to reset the photodiode.

In this case, it is desirable that the output signals of the first and second processing units are simultaneously transmitted to the first and second output signal lines that are arranged in each column.

According to another embodiment of the present invention, a unit pixel in a CMOS image sensor including an array of unit pixels may be connected to an output signal line arranged in each column of the array. In this case, the first and second processing units are connected the same output signal line.

Here, the CMOS image sensor according to the present invention may further include two switches that are arranged between the output signal line and two analog to digital converters corresponding to the first and second processing units.

In this embodiment, the first and second processing units may be applied with any structure. For example, the first processing unit may have a 4-transistor structure including a first floating diffusion that receives and stores the electrons accumulated in the photodiode; a first transfer gate transistor that controls transferring of the electrons accumulated in the photodiode to the first floating diffusion; a first reset transistor that resets a voltage value of the first floating diffusion; a first source follower transistor that amplifies and outputs a voltage value of the first floating diffusion; and a first address transistor that connects the output of the first source follower transistor to the first output signal line.

Hereinbefore, only an example including the first and second processing units in a unit pixel has been described. However, the unit pixel may further include at least one processing unit connected to the photodiode, that amplifies a floating diffusion voltage of its own formed by being provided with the electrons accumulated in the photodiode during an exposure integration time separated from the first and second exposure integration times.

According to yet another embodiment of the present invention, a sensing method of a CMOS image sensor including an array of unit pixels includes dividing a shuttering section to obtain an image frame into a first exposure integration time and a second exposure integration time; performing double shuttering by implementing a procedure to accumulate electrons in a photodiode during the first exposure integration time, transfer and store the electrons in a first floating diffusion and then accumulate electrons in the photodiode during the second exposure integration time, transfer and store the electrons in a second floating diffusion, the procedure being simultaneously implemented for all pixels of the pixel array; performing sampling by reading voltages generated by the electrons stored in the first and second floating diffusions through the double shuttering according a double sampling method respectively, and to transmit the voltages to the output signal lines connected to the unit pixel; and sequentially repeating the sampling row by row in the pixel array, the sampling being simultaneously performed with respect to all unit pixels of each row, thereby embodying a method for obtaining a double exposure integration time global shuttering image.

According to yet another embodiment of the present invention, a sensing method of a CMOS image sensor including an array of unit pixels, includes dividing a shuttering section to obtain an image frame into a first exposure integration time and a second exposure integration time; performing double shuttering by accumulating electrons in a photodiode during a first exposure integration time, transferring and storing the electrons in the first floating diffusion, and then accumulating the electrons in the photodiode during a second exposure integration time; performing sampling by reading a voltage generated by the electrons stored in the first floating diffusion according to a double sampling method, reading a voltage generated by the electrons which are accumulated in the photodiode during the second exposure integration time and transferred into the second floating diffusion according to a correlated double sampling method and transmitting the voltages to the output signal lines connected to the unit pixel; and sequentially repeating the double shuttering and the sampling connected continuously row by row in the unit pixel array, thereby embodying a method for obtaining a double exposure integration time rolling shuttering image.

Here, it is desirable that the sampling includes simultaneously transmitting the voltages generated by the electrons stored in the first and second floating diffusions to two output signal lines arranged in each column of unit pixel array, respectively.

Hereinafter, the present invention will be described in more detail with reference to the accompanying drawings.

Figure 2:
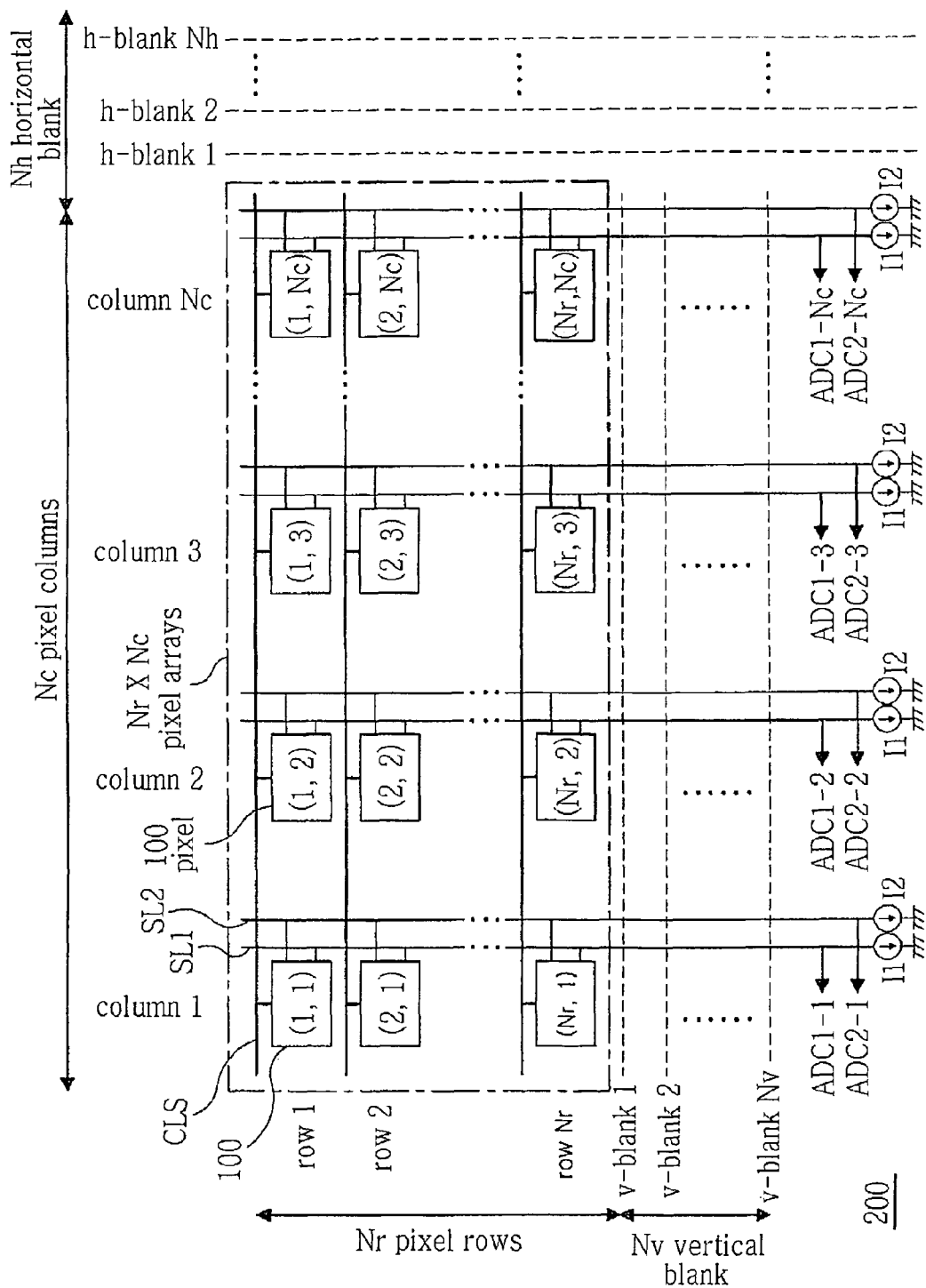
FIG. 2 is a conceptual diagram of a CMOS image sensor structure having a unit pixel shown in FIG. 1.

FIG. 1 is a circuit diagram showing a unit pixel of a CMOS image sensor according to an embodiment of the present invention, and FIG. 2 is a conceptual diagram of a CMOS image sensor structure having a unit pixel shown in FIG. 1.

In a pixel according to the present invention, a plural number (K) of processing units shutter and sample electrons accumulated in a photodiode during a shuttering section for an image frame after dividing the shuttering section into plural sections, thereby widening the dynamic range of the pixel responding to the light.

Each pixel of the image sensor according to the present invention performs the sampling procedure to read signals obtained by shuttering using a separate circuits and includes output signal lines corresponding to the number (K) of the processing units, thereby enabling the sampling signals to be output simultaneously. FIGS. 1 and 2 show examples (K=2) which include two processing units and two output signal lines corresponding to the two processing units.

Referring to FIG. 1, the CMOS image sensor pixel 100 of the present invention includes a photodiode PD that converts light signal into electrons, a first processing unit 110 that amplifies voltage formed by being provided with electrons accumulated in the photodiode PD and outputs amplified signal V1, a second processing unit 130 that amplifies voltage formed by being provided with electrons accumulated in the photodiode PD and outputs amplified signal V2, and an erasing transfer gate transistor M30 (hereinafter, referred to erasing transfer gate) connected between the power supply voltage VDD and the photodiode PD. The erasing transfer gate M30 operates by the signal ERx so as to discharge electrons accumulated in the photodiode PD and resets the photodiode PD.

The first processing unit 110 is connected to the first output signal line SL1, and the second processing unit 130 is connected to the second output signal line SL2.

It is desirable that the first and second processing units 110 and 130 have the same circuit structure with each other. While the first processing unit 110 and second processing unit 130 of FIG. 1 suggest examples of a 4-transistor structure, any structure of CMOS circuit can be used if it amplifies the voltage formed by being provided with electrons accumulated in the photodiode PD when exposed to the light and outputs the voltage.

The first processing unit 110 includes a first floating diffusion FD1, a first transfer gate transistor M11 (hereinafter, referred to 'transfer gate' simply), a first reset transistor M13, a first source follower transistor M15 and a first address transistor M17.

The first floating diffusion stores electrons transferred from the photodiode PD and the voltage caused by them changes according to the number of the electrons.

The first transfer gate M11 is connected between the photodiode PD and the first floating diffusion FD1 and operates by the transfer gate signal Tx1 so that it transfers the charge of the photodiode PD to the first floating diffusion FD1.

The first reset transistor M13 is connected between the first floating diffusion FD1 and the power supply voltage VDD, and operates by a reset signal RST1 so that it resets the voltage stored in the first floating diffusion FD1. The first source follower transistor M15 receives the voltage of the first floating diffusion on its gate terminal and outputs amplified signal V1 on its source terminal. The first address transistor M17 operates by the address signal AD1 and connects the source terminal of the first source follower transistor M15 to a first output signal line SL1, thereby outputting the signal V1.

The second processing unit 130 having the same structure as the first processing unit 110 includes a second floating diffusion FD2, a second transfer gate M21 operated by a transfer gate signal Tx2, a second reset transistor M23 operated by a reset signal RST2, a second source follower transistor M25 that operates as a source follower and outputs signal V2, and a second address transistor M27 that operated by an address signal AD2 and transmits the output signal V2 to the second line SL2. Each transistor M21 to M27 of the second processing unit 130 according to the example of FIG. 1 corresponds to each transistor M11 to M17 of the first processing unit 110 and can be described in the same manner except what is particularly mentioned.

The first current source 11 connected to the first output signal line SL1 forms a source follower amplifier together with a first source follower transistor M15, and a second current source 12 connected to the second output signal line SL2 forms a source follower amplifier together with a second source follower transistor M25.

Pixels 100 each having the structure shown in FIG. 1 as described above form arrays and then a CMOS image sensor of the present invention. FIG. 2 shows an example of it, which is a CMOS image sensor 200 of Nr×Nc array which has a unit pixel of the pixel shown in FIG. 1.

Referring to FIG. 2, each pixel 100 is connected to two signal lines, that is, a first output signal line SL1 and a second output signal line SL2, both lines being separately arranged in each column, and connected to control signal lines CLs arranged in each row. Since one column includes two output signal lines, that is, a first output signal line SL1 and a second output signal line SL2, an image sensor having Nc columns includes output signal lines of Nc×2.

The control signal lines CLs transmit a signal ERx, transfer gate signals Tx1 and Tx2, reset signals RST1 and RST2 and address signals AD1 and AD2, and it is common in pixels of each row. The control signal lines CLs control the pixels in the assigned row of the image sensor 200.

Additionally, the CMOS image sensor 200 may further include Nv number of vertical blanks and Nh number of horizontal blanks as shown in FIG. 2. The vertical blanks and horizontal blanks are virtual pixel arrays that are inserted according to operational need for timing of the image sensor, which have only clock counting assigned without physical substance. For example, the horizontal blank is used to control the operation time corresponding to one row of the pixel array and the vertical blank is used to control the time corresponding to one frame.

A procedure that the pixel 100 of the present invention obtains an image signal through the light exposure of the photodiode PD includes shuttering operation and sampling operation to read out signals obtained by the shuttering operation.

The pixel 100 may include plural processing units, and a shuttering section for one image frame is divided into plural sections corresponding to the number of the processing units. The shuttering is separately performed in each of the plural sections by each processing unit. Further, the image sensor 200 simultaneously samples the signals with as many output signal lines as the number of processing units of a unit pixel each column, or sequentially samples the signals with one output signal line.

Since the pixel 100 of FIG. 1 includes two processing units 110 and 130, the exposure integration time of one image frame is divided into a first exposure integration time T1 and a second exposure integration time T2. The first exposure integration time T1 is an exposure integration time for the first processing unit 110 and the second exposure integration time T2 is an exposure integration time for the second processing unit 130. To perform an image sensing having wide dynamic range, it is desirable to make the difference between the first and second exposure integration time T1 and T2 large.

The first and second processing unit 110 and 130 simultaneously transmit voltage signals V1 and V2 that are proportional to the number of electrons accumulated in the photodiode PD during the respective exposure integration times to the first and second output signal lines SL1 and SL2. The voltage signals V1 and V2 simultaneously output from the pixel 100 are transmitted to two analog to digital converters ADC1 and ADC2 (not shown), respectively, so that they are converted into digital image signal values of the pixel 100.

The CMOS image sensor 200 shown in FIG. 2 can also be applied to a global shuttering method and a rolling shuttering method.

Figure 3:
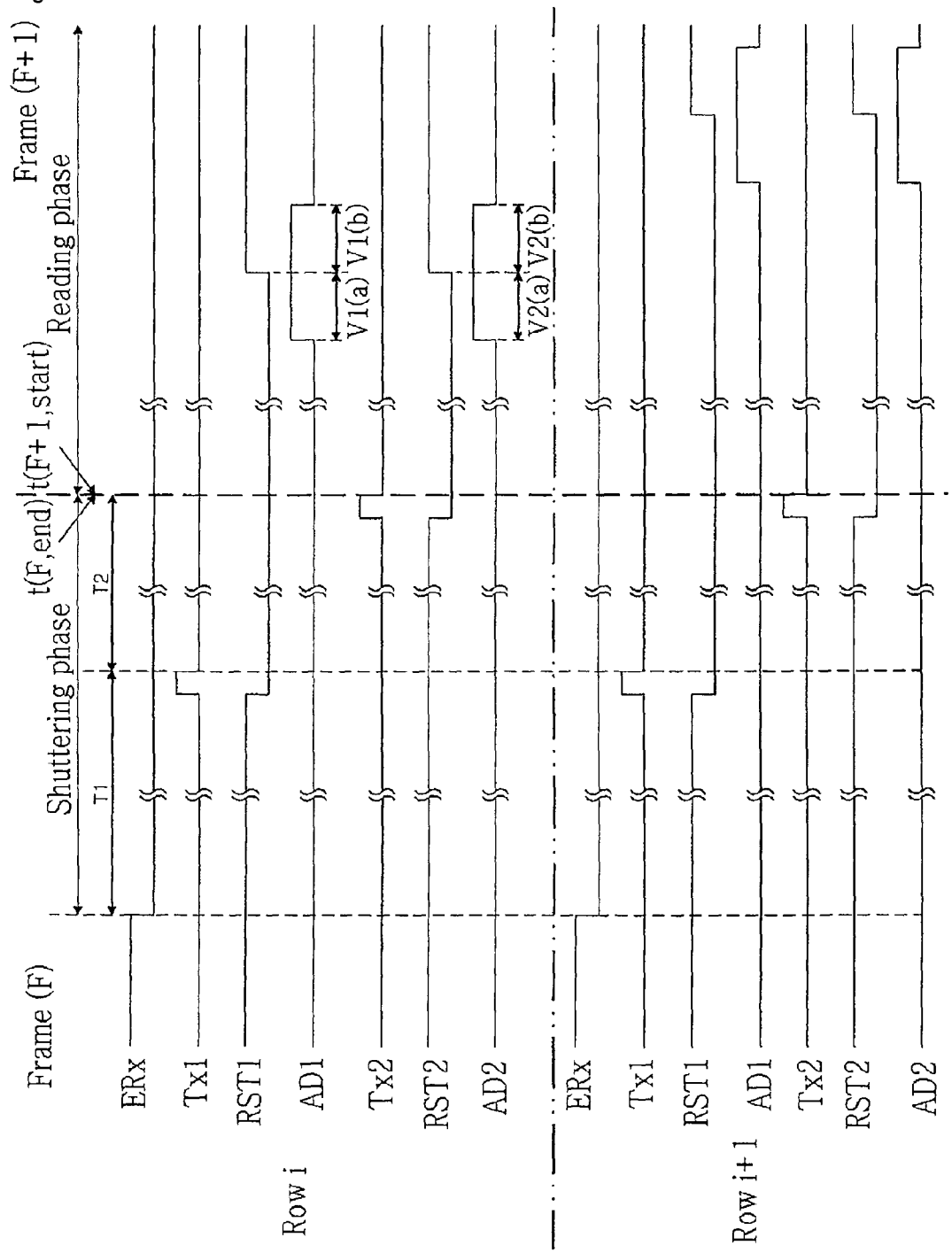
FIG. 3 is a timing diagram provided to describe a global shuttering operation.

Hereinafter, referring to FIGS. 2 to 4, a description will be given to an operation of the image sensor 200 of the present invention using double exposure integrations. FIG. 3 is a timing diagram provided to describe the global shuttering operation, and FIG. 4 is a timing diagram provided to describe the rolling shuttering operation.

Figure 4:
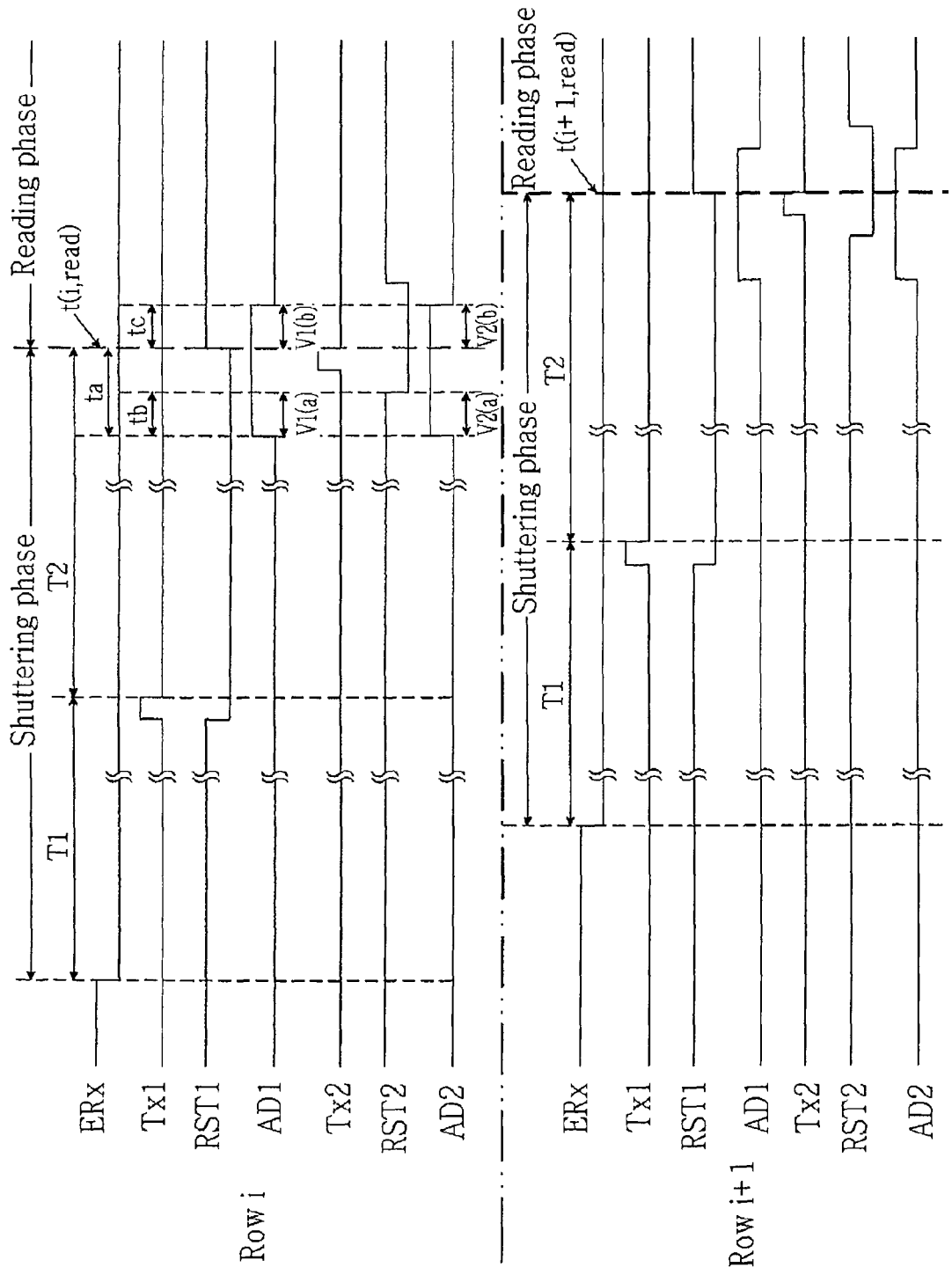
FIG. 4 is a timing diagram provided to describe a rolling shuttering operation.

The timing diagrams of FIGS. 3 and 4 are examples in the case that the pixel 100 shown in FIG. 1 is embodied in N-type transistors. Further, hereinafter, in reference to N type transistors, the voltage used when signals ERx, Tx1,Tx2, RST1, RST2, AD1 and AD2 turn on the transistor is referred to 'logic high' and the voltage used when the signals turn off the transistor is referred to 'logic low'. Of course, when the pixel 100 shown in FIG. 1 is embodied in P-type transistors, the signals should be 'logic low' to turn on the transistor.

First, an operation of the global shuttering method is described with reference to FIG. 3. According to the global shuttering method, shuttering operation is performed to the entire pixel arrays simultaneously, and a signal reading out and digital coding procedure by a double sampling after the shuttering operation is sequentially performed row by row.

It is assumed that the time when the last vertical blank, v-blank Nv of the current image frame F is read out is t(F, end)=t(F+1, start). The shuttering for the next image frame (F+1) is progressed while the current image frame F information is sampled, which is divided into a first shuttering for the first exposure integration time T1 and a second shuttering for the second exposure integration time T2. While FIG. 3 illustrates a case that the first exposure integration time T1 and the second exposure integration time T2 are continuously progressed, it is not necessary to progress the first exposure integration time T1 and the second exposure integration time T2 continuously.

In order to obtain the next image frame (F+1), as the signal ERx changes from logic high to logic low at time t(F, end)−T1−T2, an erasing transfer gate M30 is turned off and the photodiode PD starts to accumulate signal electrons by photoelectric conversion.

At first, before reaching t(F, end)−T2, a first reset transistor M13 is turned off first by the reset signal RST1 to float the first floating diffusion FD1, and the first transfer gate M11 is turned on by the transfer gate signal Tx1 to start transferring signal electrons integrated by the photodiode PD during the first exposure integration time T1 to the first floating diffusion FD1.

At time t(F, end)−T2, the first transfer gate M11 is turned off again to separate the photodiode PD and the first floating diffusion FD1 with each other, so that the first shuttering of the first processing unit 110 is completed. Hereby the signal electrons integrated during the first exposure integration time T1 are stored in the first floating diffusion FD1, the photodiode PD is in an empty state without any signal electron.

The erasing transfer gate M30 keeps the turn off state by the signal ERx until the time t(F, END), so that the photodiode PD accumulates the signal electrons again during the second exposure integration time T2 following the first exposure integration time T1.

The second shuttering of the second processing unit 130 is performed in the same manner of the first shuttering of the first processing unit 110.

Before reaching t(F, end), as the second reset transistor M23 is turned off first by the reset signal RST2, the second floating diffusion FD2 is floated and the second transfer gate M21 is turned on by the transfer gate signal Tx2, so that the signal electrons integrated in the photodiode PD during the second exposure integration time T2 are transferred to the second floating diffusion FD2. After then, at t(F, end), the second transfer gate M21 is turned off again so that the photodiode PD and the second floating diffusion FD2 are separated from each other. Accordingly, the second shuttering in which the signal electrons integrated during the second exposure integration time are stored in the second floating diffusion FD2 is completed. The time needed for the transfer gate signal Tx1 or Tx2 to keep logic high is sufficient if it is the time taken for the electrons integrated in the photodiode PD to be completely transferred to the first floating diffusion FD1 or the second floating diffusion FD2 or so.

In order to obtain signals of the image frame (F+1), the shuttering operation described above that is performed from time t(F, end)−T1−T2 is simultaneously performed for all pixels including Row i and Row i+1 of the image sensor 200. That is, the photodiodes of all pixels in the pixel array simultaneously accumulate the signal electrons and the accumulated signal electrons are simultaneously transferred to the floating diffusion to be stored, so that the global shuttering is performed. Here, it is noteworthy that the time Tv assigned to the Nv number of all vertical blanks should be equal to or longer than the second exposure integration time T2 in order that the global shuttering operation for the image frame (F+1) does not damage the signals of the image frame (F).

Hereinafter, signal reading out and digital coding procedure by a double sampling method in the global shuttering will be described. From the start time t(F+1, start) of the image frame F+1, the Nr number of rows sequentially operate one by one to read the output signal. However, the output signals of all pixels in a row are read out in parallel. As the Row i shown in FIG. 3 is performed in the order of ith, it shows that signal reading out and digital coding procedure is performed by the double sampling after predetermined time has passed from the time t(F+1, start).

The first address transistor M17 of the first processing unit 110 is turned on by the address signal AD1 to connect the output terminal of the first source follower transistor M15 to the first output signal line SL1. The voltage of the first floating diffusion FD1 is amplified by the first source follower transistor M15, and the amplified voltage V1($a$) is output to the first output signal line SL1.

Subsequently, as the reset signal RST1 becomes a logic high state again, the first reset transistor M13 resets the first floating diffusion FD1, and the voltage V1($b$) of the first floating diffusion reset also is output to the first output signal line SL1 through the first source follower transistor M15. While the voltages V1($a$) and V1($b$) are output through such a double sampling procedure, the address signal AD1 keeps logic high. The analog to digital converter ADC1 finally converts the voltage difference between the V1($a$) and V1($b$) output by the double sampling, V1=[V1($b$)−V1($a$)] into a digital code value.

The signal reading out and digital coding procedure by the double sampling of the second processing unit 130 is simultaneously processed together with and in parallel to the first processing unit 110. In other words, while the sampling is performed, the reset signal RST2 and the address signal AD2 experience the same status of change as the reset signal RST1 and the address signal AD1. Accordingly, the voltage of the second floating diffusion FD2 also is double-sampled simultaneously and in parallel to the sampling operation of the first processing unit 110, to output V2($a$) and V2($b$) and transmitted to the second output signal line SL2. Accordingly, a burden for time to process the signal is reduced.

In the same manner, the analog to digital converter ADC2 finally converts the difference between the voltages V2($a$) and V2($b$) output from the double sampling, V2=[V2($b$)−V2($a$)] into a digital code value.

The above described double sampling is simultaneously performed for all pixels belonging to each row. After the double sampling of Row i is completed as shown in FIG. 3, the double sampling of Row i+1 is performed immediately.

Hereinafter, referring to FIG. 4, an operation method of a rolling shuttering scheme is described. Here, in the same manner, to obtain image sensing with wide dynamic range, it is desirable to set the difference between the first exposure integration time T1 and the second exposure integration time T2 large.

In the rolling shuttering scheme, both the shuttering operation and the sampling operation are sequentially progressed row by row, differently from the global shuttering. For example, all operations of Row i+1 (shuttering and sampling) are identical to all operations of Row i, except that the operation of Row i+1 occurs a certain time later than Row i.

It is assumed that the time to output and read the signal of Row i is t (i, read). At time t(i, read)−T1−T2, as the signal ERx changes from logic high to logic low, the erasing transfer gate M30 is turned off and the photodiode PD starts to accumulate the signal electrons by photoelectric conversion.

Before reaching t(i, read)−T2, as the reset signal RST1 changes to logic low, the first reset transistor M13 of the first processing unit 110 is turned off so that the first floating diffusion FD1 is floated, and the first transfer gate M11 is turned on by the transfer gate signal Tx1 so that it transfers the signal electrons integrated by the photodiode PD during the first exposure integration time T1 to the first floating diffusion FD1. At t(i, read)−T2, the first transfer gate M11 is turned off again so that the photodiode PD and the first floating diffusion FD1 are separated from each other. Hereby the signal electrons integrated during the first exposure integration time are stored in the first floating diffusion FD1, and the photodiode PD is in an empty state without any signal electron.

By keeping the erasing transfer gate M30 turned off until the time t(i, read), the photodiode PD accumulates the signal electrons again during the second exposure integration time T2. The shuttering procedure of the second processing unit 130 according to the second exposure integration time T2 is completed at t(i, read).

The rolling shuttering in each row of the image sensor 200 is different from the global shuttering in that the shuttering operation and the signal reading out operation are continuously performed as a series of operations row by row. In the global shuttering scheme signal reading out operation row by row is separated from the shuttering operation which globally occurs in the array. In the rolling shuttering, output signals of the first processing unit 110 are read out with the double sampling method, and output signals of the second processing unit 130 are read out with the correlated double sampling CDS method.

At t(i, read)−ta before reaching t(i, read), the first address transistor M17 of the first processing unit 110 is turned on by the address signal AD1 so that it connects the output terminal of the first source follower transistor M15 to the first output signal line SL1. Since the reset signal RST1 is still in a logic low state, the first floating diffusion FD1 is floated and the voltage of the first floating diffusion FD1 formed by the electrons transferred from the photodiode PD is amplified by the first source follower transistor M15, and the amplified voltage V1($a$) is output to the first output signal line SL1 during tb section.

Further, as the reset signal RST1 is switched to the logic high state again at t(i, read), the voltage of the first floating diffusion FD1 reset by the first reset transistor M13 is amplified by the first source follower transistor M15, and the amplified voltage V1(b) is output to the first output signal line SL1 through the first source follower transistor M15 during tc section. While the voltages V1(a) and V1(b) are output through such a double sampling procedure, the address signal AD1 keeps logic high. The analog to digital converter ADC1 finally converts the difference between the voltages V1(a) and V1(b) output by the double sampling, V1=[V1(b)–V1(a)] into a digital code value.

The second processing unit 130 performs the correlated double sampling in order to output the signals V2(a) and V2(b) to the second output signal line SL2, simultaneously with the output of the first processing unit 110.

While the address signal AD2 changes to logic high at the same time as the address signal AD1 changes from logic low to logic high, the reset signal RST2 keeps logic high since the second exposure integration time T2 was not finished. The second address transistor M27 of the second processing unit 130 is turned on so that it connects the output terminal of the second source follower transistor M25 to the second output signal line SL2. Hereby the voltage V2(a) of the second floating diffusion FD2 that is kept in a reset state is transmitted to the second output signal line SL2 during tb time.

After then, as the reset signal RST2 changes from logic high to logic low at t(i, read)–ta+tb, the reset transistor M23 is turned off so that it floats the second floating diffusion FD2, and the second transfer gate M21 is turned on so that it connects the photodiode PD and the second floating diffusion FD2 with each other and transfers the signal electrons accumulated in the photodiode PD during the second exposure integration time T2 to the second floating diffusion FD2 until t(i, read). The voltage V2(b) of the second floating diffusion FD2 is amplified by the second source follower transistor M25 and transmitted to the second output signal line SL2 during the section from t(i, read) to t(i, read)+tc.

As such, the difference between two output voltages V2(a) and V2(b) through the correlated double sampling CDS procedure, V2=[V2(a)–V2(b)] is converted into a digital code value in the analog to digital converter ADC2.

Other Embodiments

Figure 5:
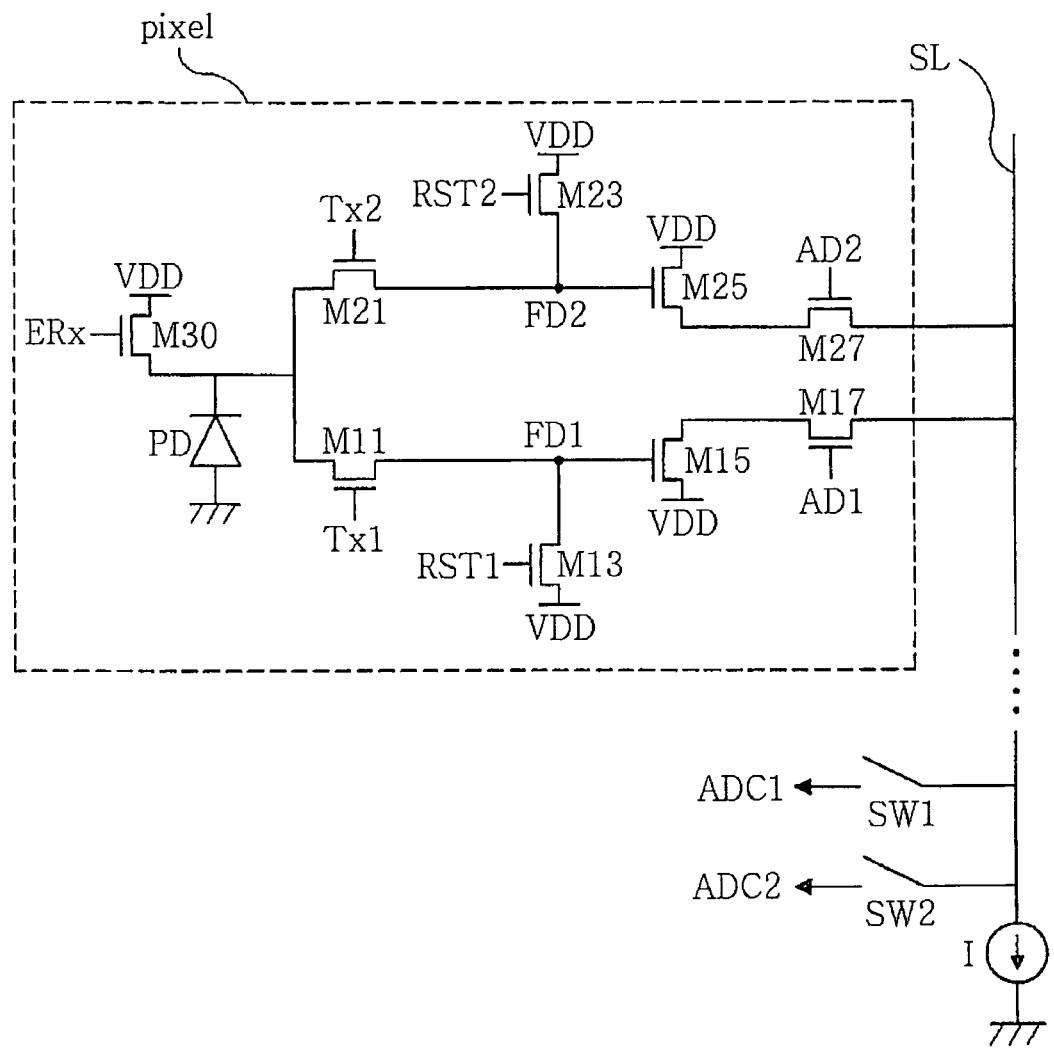
FIGS. 5 to 7 are circuit diagrams showing CMOS image sensors according to other embodiments of the present invention.

FIG. 5 is a circuit diagram showing a unit pixel of a CMOS image sensor according to other embodiment of the present invention, that is an example in which one output signal line SL is arranged in replace of the first output signal line SL1 and the second output signal lines SL2 shown in FIG. 1.

Instead of that, a first switch SW1 that operates synchronously with the first address transistor M17 without any phase difference is arranged between the output signal line SL and an analog to digital converter ADC1 (not shown), and a second switch SW2 that operates synchronously with the second address transistor M27 without any phase difference is arranged between the output signal line SL and an analog to digital converter ADC2(not shown).

The example shown in FIG. 5 has an effect that an area of the pixel array is reduced compared with the case that the number of output signal lines connected to the pixel is two like FIG. 1. However, it is not possible to output two signals V1 and V2 from the pixel at the same time completely and in parallel with each other but with a small time gap between them.

Figure 6:
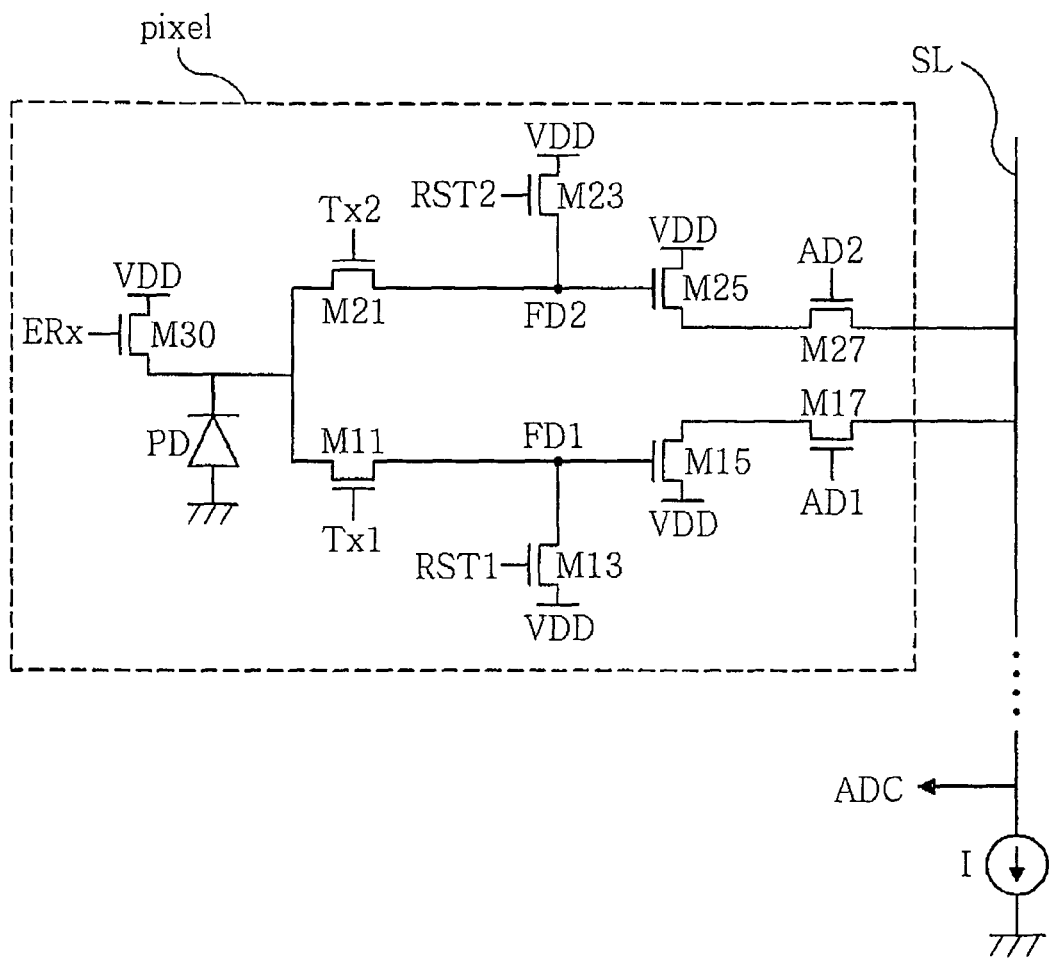

According to other embodiment, it is possible to include an output signal line SL and only one analog to digital converter ADC omitting the first and second switches SW1 and SW2 in the example of FIG. 5. FIG. 6 is an example of it.

Two signals from the pixel 100 cannot simultaneously be output through the first and second address transistors M17 and M27 but are sequentially connected to one analog to digital converter ADC in a time division manner. It is possible to reduce a pixel array area and an area of a signal processing circuit portion using such a structure. However, since it is necessary to divide the time assigned to one row into two parts to process two signals from the pixel, there are some burdens in signal processing speed.

Figure 7:
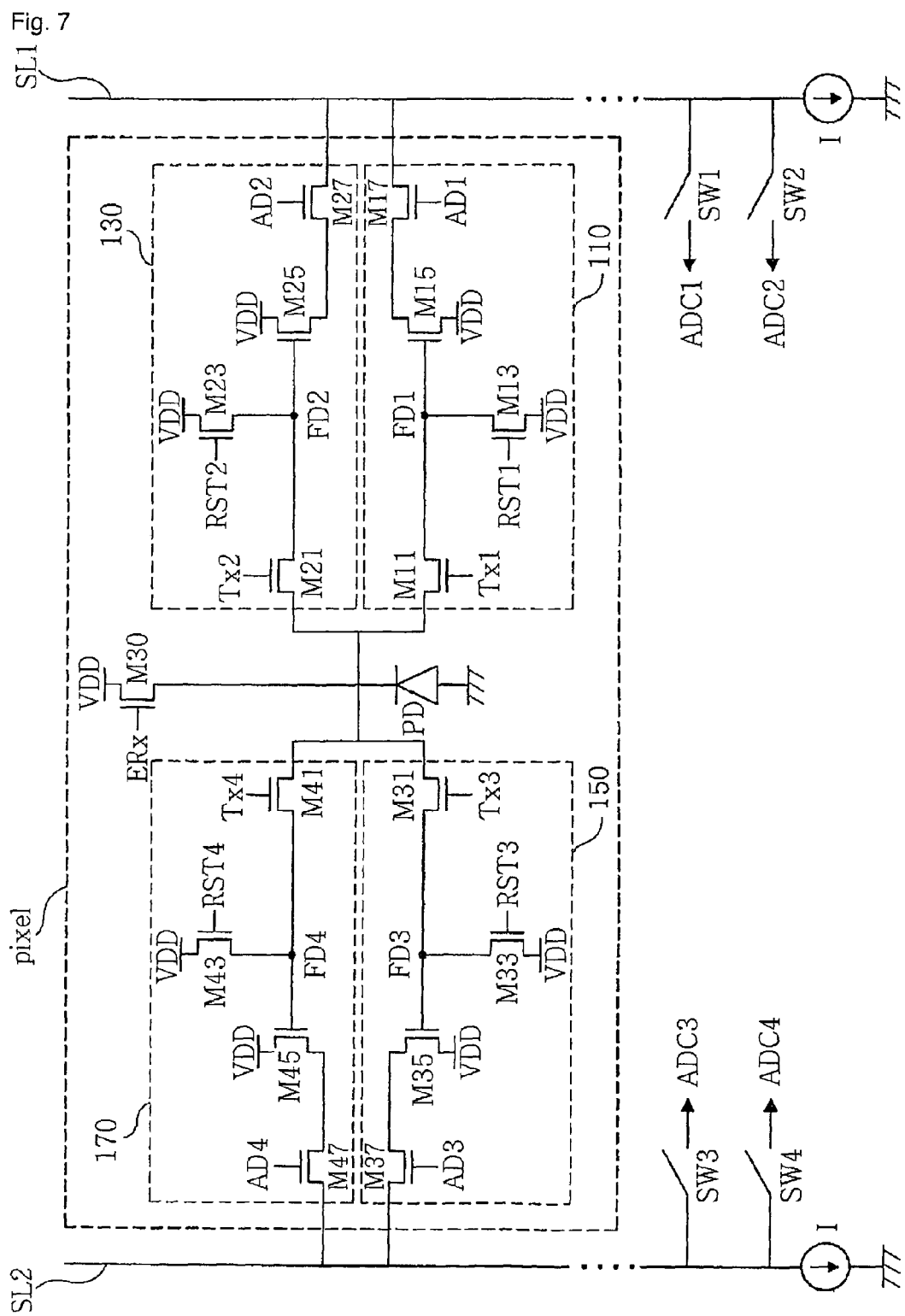

FIG. 7 shows an example of a pixel including four processing units 110 to 170. Each processing unit 110 to 170 can store signal electrons corresponding to four exposure integration times T1, T2, T3 and T4 in four floating diffusions FD1, FD2, FD3 and FD4, and output voltage signals corresponding to them to the outside. Operations of both global shuttering and rolling shuttering schemes can be applied to the pixel structure.

It will be apparent to those of ordinary skill in the art that various modifications can be made to the exemplary embodiments of the invention described above. However, as long as modifications fall within the scope of the appended claims and their equivalents, they should not be misconstrued as a departure from the scope of the invention itself.

Industrial Applicability

The CMOS image sensor according to the present invention includes a unit pixel that integrates electrons generated by the exposure of the light in many times using one photodiode, and outputs plural signals which correspond to the multiple exposure integrations in parallel, thereby largely improving the dynamic range within which an image sensor properly responds to the brightness of the light.

REFERENCE SIGNS LIST

100: pixel
200: image sensor
PD: photodiode
110: first processing unit
130: second processing unit 130
M30: erasing transfer gate M30
SL1: first output signal line SL1
SL2: second output signal line SL2
M13: first reset transistor M13
M23: second reset transistor M23
FD1: first floating diffusion FD1
FD2: second floating diffusion FD2
M17: first address transistor M17
M27: second address transistor M27
M15: first source follower transistor M15
M25: second source follower transistor M25

The invention claimed is:

1. A CMOS image sensor including an array of unit pixels, each unit pixel being connected to a first output signal line and a second output signal line which are arranged in each column of the array, wherein the unit pixel comprises:
   a photodiode;
   a first processing unit connected to the photodiode, that amplifies a first floating diffusion voltage formed by being provided with electrons accumulated in the photodiode during a first exposure integration time and outputs the amplified voltage to the first output signal line;
   a second processing unit connected to the photodiode, that amplifies a second floating diffusion voltage formed by being provided with electrons accumulated in the photodiode during a second exposure integration time which is separated from the first exposure integration time and outputs the amplified voltage to the second output signal line; and an erasing transfer gate transistor arranged between the photodiode and a power supply voltage, the erasing transfer gate transistor is kept turned off during both first and second exposure integration times wherein electrons accumulate in the photodiode, otherwise the erasing transfer gate transistor discharges electrons accumulated in the photodiode, so as to reset the photodiode;

wherein the electrons are transferred to and stored in the first floating diffusion before beginning the second exposure integration and then the electrons again accumulate in the photodiode and are transferred to and stored in the second floating diffusion.

2. The CMOS image sensor according to claim 1, wherein the output signals of the first and second processing units are simultaneously transmitted to the first and second output signal lines that are arranged in each column.

3. The CMOS image sensor according to claim 1, wherein the first processing unit includes:
a first floating diffusion that receives and stores the electrons accumulated in the photodiode;
a first transfer gate transistor that controls transferring of the electrons accumulated in the photodiode to the first floating diffusion;
a first reset transistor that resets a voltage value of the first floating diffusion;
a first source follower transistor that amplifies and outputs a voltage value of the first floating diffusion; and
a first address transistor that connects the output of the first source follower transistor to the first output signal line, and
the second processing unit includes:
a second floating diffusion that receives and stores the electrons accumulated in the photodiode;
a second transfer gate transistor that controls transferring of the electrons accumulated in the photodiode to the second floating diffusion;
a second reset transistor that resets a voltage value of the second floating diffusion;
a second source follower transistor that amplifies and outputs a voltage value of the second floating diffusion; and
a second address transistor that connects the output of the second source follower transistor to the second output signal line.

4. The CMOS image sensor according to claim 1, further comprising at least one processing unit connected to the photodiode, that amplifies a floating diffusion voltage of its own formed by being provided with the electrons accumulated in the photodiode during an exposure integration time separated from the first and second exposure integration times.

5. A CMOS image sensor including an array of unit pixels, each unit pixel being connected to an output signal line that is arranged in each column of the array, wherein the unit pixel comprises:
a photodiode;
a first processing unit connected to the photodiode, that amplifies a first floating diffusion voltage formed by being provided with electrons accumulated in the photodiode during a first exposure integration time and transmits the amplified voltage to the output signal line;
a second processing unit connected to the photodiode, that amplifies a second floating diffusion voltage formed by being provided with electrons accumulated in the photodiode during a second exposure integration time which is separated from the first exposure integration time and transmits the amplified voltage to the output signal line; and an erasing transfer gate transistor arranged between the photodiode and a power supply voltage, the erasing transfer gate transistor is kept turned off during both first and second exposure integration times wherein electrons accumulate in the photodiode, otherwise the erasing transfer gate transistor discharges electrons accumulated in the photodiode so as to reset the photodiode;

wherein the electrons are transferred to and stored in the first floating diffusion before beginning the second exposure integration and then the electrons again accumulate in the photodiode and are transferred to and stored in the second floating diffusion.

6. The CMOS image sensor according to claim 5, further comprising two switches arranged between the output signal line and two analog to digital converters corresponding to the first and second processing.

7. The CMOS image sensor according to claim 5, further comprising at least one processing unit connected to the photodiode, that amplifies the floating diffusion voltage of its own formed by being provided with electrons accumulated in the photodiode during an exposure integration time separated from the first and second exposure integration times and outputs the amplified voltage to the output signal line.

8. A sensing method of a CMOS image sensor including an array of unit pixels, comprising:
dividing a shuttering section to obtain an image frame into a first exposure integration time and a second exposure integration time;
performing double shuttering by implementing a procedure to accumulate electrons in a photodiode during the first exposure integration time, transfer and store the electrons in a first floating diffusion and then accumulate electrons accumulated in the photodiode during the second exposure integration time, transfer and store the electrons in a second floating diffusion, the procedure being simultaneously implemented for all pixels of the pixel array;
performing sampling by reading voltages generated by the electrons stored in the first and second floating diffusions through the double shuttering according to a double sampling method respectively, and transmitting the voltages to output signal lines connected to the unit pixel, corresponding to multiple exposure integrations in parallel; and
sequentially repeating the sampling row by row in the pixel array, the sampling being simultaneously performed with respect to all unit pixels of each row.

9. The sensing method according to claim 8, wherein the sampling includes simultaneously transmitting the voltages generated by the electrons stored in the first and second floating diffusions to two output signal lines arranged in each column of unit pixel array, respectively.

10. A sensing method of a CMOS image sensor including an array of unit pixels, comprising:
dividing a shuttering section to obtain an image frame into a first exposure integration time and a second exposure integration time;
performing a double shuttering by accumulating electrons in a photodiode during a first exposure integration time, transferring and storing the electrons in the first floating diffusion, and then accumulating electrons in the photodiode during a second exposure integration time;
performing sampling by reading a voltage generated by the electrons stored in the first floating diffusion according to a double sampling method, reading a voltage generated by the electrons which are accumulated in the photodiode during the second exposure integration time and transferred into the second floating diffusion according to a correlated double sampling method and transmitting the voltages to output signal lines connected to the unit pixel, corresponding to multiple exposure integrations in parallel; and sequentially repeating the double shuttering and the sampling connected continuously row by row in the unit pixel array.

* * * * *